United States Patent
Wu et al.

(10) Patent No.: US 9,344,067 B1
(45) Date of Patent: May 17, 2016

(54) DUAL INTERLOCKED CELL (DICE) STORAGE ELEMENT WITH REDUCED CHARGE SHARING

(71) Applicant: Altera Corporation, San Jose, CA (US)

(72) Inventors: Wen Wu, Mountain View, CA (US); Yanzhong Xu, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 112 days.

(21) Appl. No.: 13/951,780

(22) Filed: Jul. 26, 2013

(51) Int. Cl.
*H03K 3/3562* (2006.01)
*H01L 27/118* (2006.01)
*H03K 3/356* (2006.01)
*H01L 27/02* (2006.01)

(52) U.S. Cl.
CPC ............ *H03K 3/356* (2013.01); *H01L 27/0207* (2013.01); *H01L 27/11807* (2013.01); *H03K 3/35625* (2013.01); *H01L 2027/11829* (2013.01); *H01L 2027/11831* (2013.01)

(58) Field of Classification Search
CPC . H03K 3/353; H03K 3/356; H03K 3/356104; H03K 3/3562; H03K 3/35625; H01L 27/0207; H01L 27/118; H01L 27/11807; H01L 2027/11829; H01L 2027/11831
See application file for complete search history.

(56) References Cited

U.S. PATENT DOCUMENTS

| | | | |
|---|---|---|---|
| 6,696,874 B2* | 2/2004 | Wood | 327/210 |
| 7,515,452 B1* | 4/2009 | de Jong et al. | 365/54 |
| 7,920,410 B1* | 4/2011 | Lee et al. | 365/154 |
| 8,178,903 B2* | 5/2012 | Nakamura | 257/206 |
| 8,432,724 B2 | 4/2013 | White | |
| 2011/0242880 A1* | 10/2011 | White | 365/154 |
| 2014/0145293 A1* | 5/2014 | Jain et al. | 257/499 |

OTHER PUBLICATIONS

Calin et al., "Upset Hardened Memory Design for Submicron CMOS Technology", IEEE Transactions on Nuclear Science, vol. 43, No. 6, Dec. 1996.

Seifert et al., "On the Radiation-Induced Soft Error Performance of Hardened Sequential Elements in Advanced Bulk CMOS Technologies", IEEE Reliability Physics Symposium, May 2010.

* cited by examiner

*Primary Examiner* — Patrick O'Neill
(74) *Attorney, Agent, or Firm* — Treyz Law Group, P.C.; Jason Tsai

(57) ABSTRACT

Integrated circuits with clocked storage elements are provided. A clocked storage element such as a flip-flop circuit may include a master latch, a slave latch, and associated control circuitry. The master and slave latches may be implemented using dual-interlocked cell (DICE) latch configurations. The DICE latch may include at least four inverting circuits having two redundant node pairs and may exhibit immunity to soft error upset (SEU) events. Each of the master and slave latches may be separated into different portions so that the redundant nodes are physically separated by interposing circuitry. The redundant nodes may also be formed in separate wells to further minimize charge sharing. The different portions of the master and slave latch may be interleaved to minimize area.

20 Claims, 6 Drawing Sheets

US 9,344,067 B1

DUAL INTERLOCKED CELL (DICE) STORAGE ELEMENT WITH REDUCED CHARGE SHARING

BACKGROUND

This relates to integrated circuits, and more particularly, to integrated circuits with storage elements that demonstrate soft error upset immunity.

Integrated circuits often contain volatile storage elements. Typical volatile storage elements may be based on cross-coupled inverters (latches). A volatile storage element retains data only so long as the integrated circuit is powered. In the event of power loss, the data in the volatile storage element is lost. Although nonvolatile storage elements such as memory elements based on electrically-erasable programmable read-only memory technology are not subject to data loss in this way, it is often not desirable or possible to fabricate nonvolatile storage elements as part of an integrated circuit.

As a result, volatile storage elements are often used. For example, a volatile storage element such as a flip-flop circuit includes a master latch and a slave latch, where each of the master and slave latches includes a pair of cross-coupled inverters. Such types of volatile storage elements are subject to a phenomenon known as soft error upset.

Soft error upset (SEU) events are caused by cosmic rays and radioactive impurities embedded in integrated circuits and their packages. Cosmic rays and radioactive impurities generate high-energy atomic particles such as neutrons and alpha particles. The storage elements contain transistors and other components that are formed from a patterned silicon substrate. When an atomic particle strikes the silicon in the storage element, electron-hole pairs are generated. The electron-hole pairs create a conduction path that can cause a charged node in the storage element to discharge and the state of the storage element to flip. If, for example, a "1" was stored in the storage element, a soft error upset event could cause the "1" to change to a "0."

Upset events in an integrated circuit corrupt the data stored in the storage elements and can have serious repercussions on system performance. In certain system applications such as remote installations of telecommunications equipment, it is extremely burdensome to repair faulty equipment. Unless integrated circuits demonstrate good immunity to soft error upset events, they will be unsuitable for these types of applications.

SUMMARY

Integrated circuits with clocked storage elements are provided. A clocked storage element such as a flip-flop (FF) circuit may include a data input, a data output, a control input configured to receive a clock signal, a first (master) latch circuit, a second (slave) latch circuit, and associated control circuitry. The first and second latches may be coupled in series between the data input and the data output. The associated control circuitry may include inverters and transmission gates for use in driving, routing, and gating data signals and control signals within the clocked storage element.

The first and second latches may both be controlled by the clock signal and may each include more than two inverting circuits interconnected to form a bistable memory element. Each of the first and second latches may include an optional read circuit that is coupled to the inverting circuits, where the read circuit is always deactivated (e.g., the read circuit is never turned on), and may include access circuits that are controlled by the clock signal.

In some embodiments, the first and second latches may be physically interleaved with respect to one another. For example, the first latch may include a first inverting circuit that drives a given data storage node and a second inverting circuit that drives a redundant data storage node associated with the given data storage node (i.e., the given data storage node and the associated redundant data storage node store data signals of equal voltage levels).

At least a part of the second latch may be physically interposed between a first portion of the first latch in which the first inverting circuit is formed and a second portion of the first latch in which the second inverting circuit is formed. Similarly, a part of the first latch may be physically interposed between different portions of the second latch. Physically separating the given data storage node and the redundant data storage node with interposing circuitry (i.e., with circuitry in the second latch and/or with the control circuitry) may help reduce undesired interaction between the two nodes.

In certain embodiments, the given data storage node may be formed in a first well region of a first doping type (e.g., in a first n-well), whereas the redundant data storage node may be formed in a second well region of the first doping type (e.g., in a second n-well). The first and second n-well regions may be separated by a third well region of a second doping type that is different than the first doping type (e.g., a p-well region may be interposed between the first and second n-well regions). Forming a p-well region between the two n-well regions may serve to reduce charge sharing between the given data storage node and the redundant data storage node. A clocked storage element formed in this way may exhibit enhanced soft error upset performance.

Further features of the present invention, its nature and various advantages will be more apparent from the accompanying drawings and the following detailed description.

DETAILED DESCRIPTION

This relates to integrated circuits with storage elements that are resistant to soft error upset events. It will be recognized by one skilled in the art, that the present exemplary embodiments may be practiced without some or all of these specific details. In other instances, well-known operations have not been described in detail in order not to unnecessarily obscure the present embodiments.

In general, storage elements can be used in any suitable integrated circuits that require storage of data. These integrated circuits may be memory chips, digital signal processing chips, microprocessors, application specific integrated circuits (ASIC), application specific standard products (ASSPs), programmable integrated circuits, or other suitable type of integrated circuits.

Figure 1:
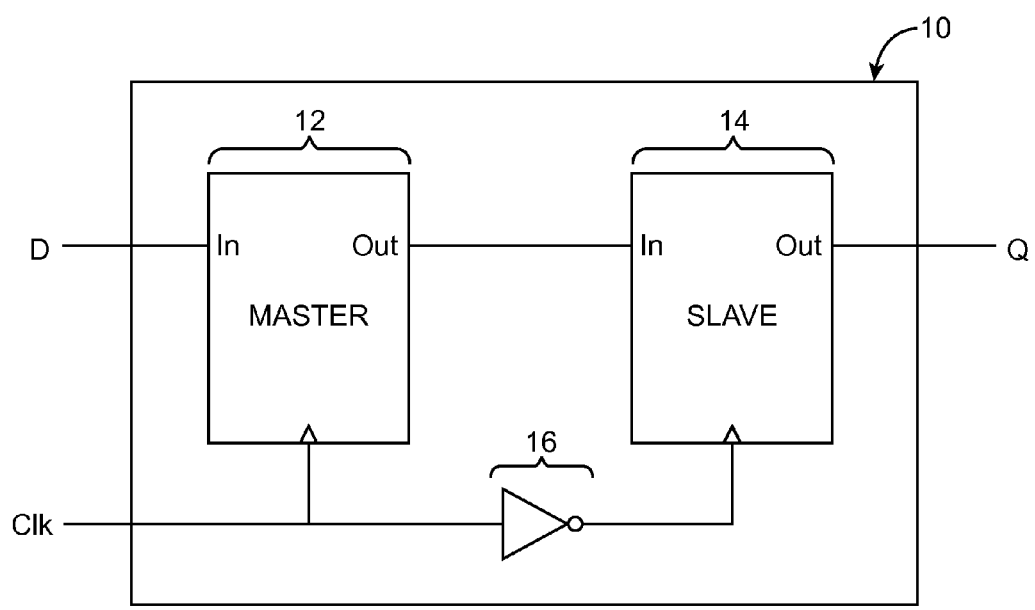
FIG. 1 is a diagram of an illustrative clocked storage element in accordance with an embodiment of the present invention.

In one embodiment, an integrated circuit may include a storage element such as clocked storage element 10 (see, e.g., FIG. 1). As shown in FIG. 1, clocked storage element 10 may include a data input terminal (e.g., an input terminal that receives a data input signal D), and data output terminal (e.g., an output terminal on which data output signal Q is generated), and a control input terminal (e.g., an input terminal that receives control signal Clk). Clocked storage element 10 may include latching circuits such as master latch circuit 12 and slave latch circuit 14 coupled in series between the data input terminal and data output terminal.

Master latch 12 and slave latch 14 may each have an input terminal (In), an output terminal (Out), and a control input. The input terminal of master latch 12 may receive data input signal D. The output of master latch 12 may be coupled to the input of slave latch 14. Data output signal Q may be generated at the output of slave latch 14. The control input of master latch 12 may receive signal Clk, whereas the control input of slave latch 12 may receive an inverted version of signal Clk (e.g., an inverted control signal that is generated using inverter 16).

Configured in this way, clocked storage element 10 may serve to latch incoming data signals D in response to rising edges in signal Clk (assuming that signal Clk is a periodic clock signal and that both master and slave latches 12 and 14 are positive level-sensitive latching circuits). The input data may be latched at the output of element 10 at falling clock edges of signal Clk (in the example of FIG. 1). Clocked storage element 10 of this type is sometimes referred to as a flip-flop circuit or a flip-flop.

Figure 2:
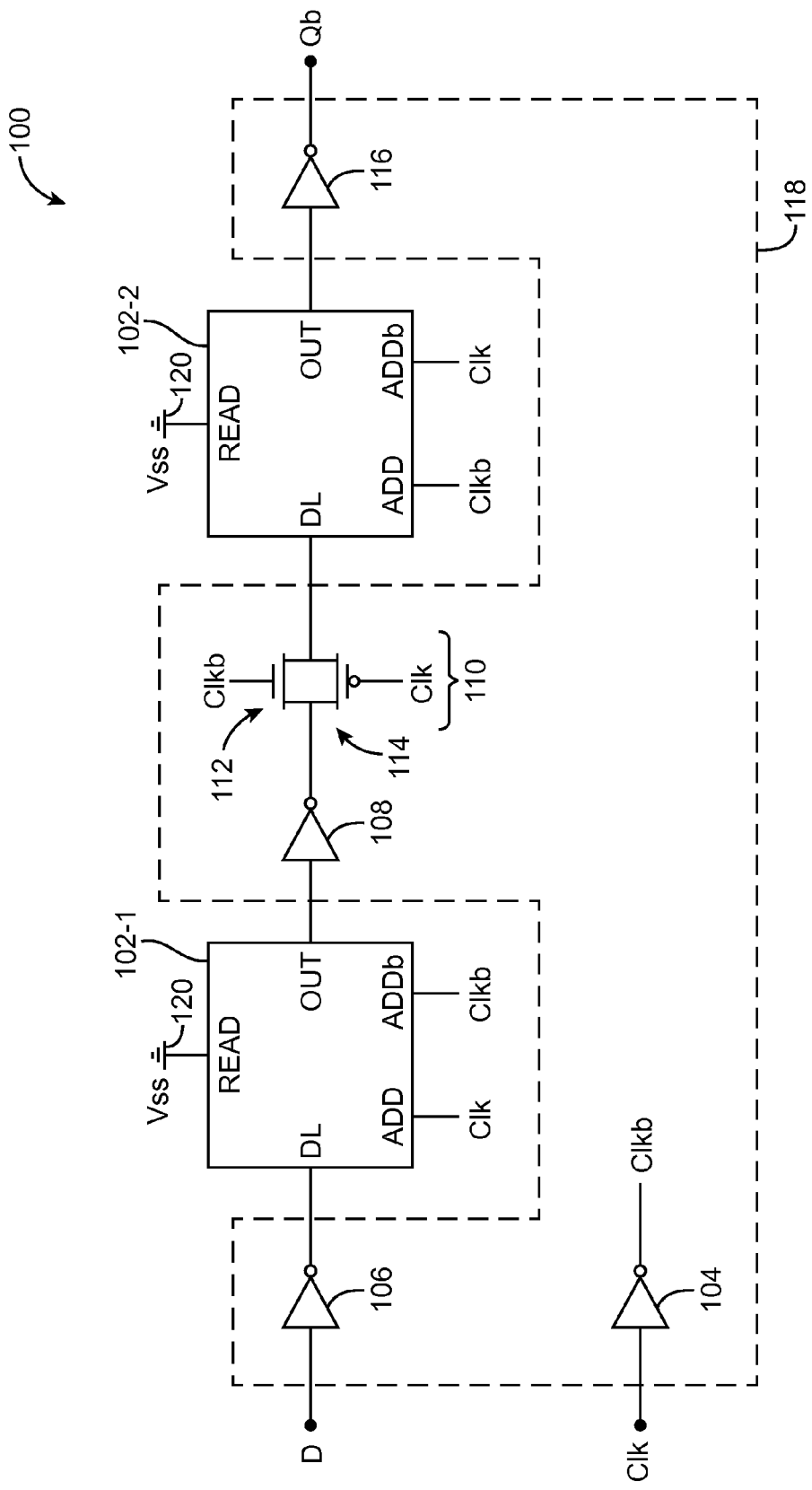
FIG. 2 is a circuit diagram of an illustrative clocked storage element implemented using dual interlocked cell (DICE) memory circuits in accordance with an embodiment of the present invention.

FIG. 2 shows one suitable circuit implementation of a flip-flop such as flip-flop 100. As shown in FIG. 2, flip-flop 100 may include latching circuits such as master latch 102-1 and slave latch 102-2, inverting circuits such as inverters 104, 106, 108, and 116, and a transmission gate such as transmission gate 110. Circuitry other than latches 102-1 and 102-2 (e.g., inverters 104, 106, 108, and 116, transmission gate 110, and other associated circuits) is sometimes collectively referred to herein as storage element control circuitry 118.

Transmission gate 110 may include an n-channel transistor 112 and a p-channel transistor 114 coupled in parallel. P-channel transistor 114 may have a gate terminal that receives control signal Clk, whereas n-channel transistor 112 may have a gate terminal that receives an inverted version of Clk (e.g., n-channel transistor 112 may be controlled using Clkb). Inverted clock signal Clkb may be generated using inverter 104. If desired, other types of transmission gates or pass gates may be used.

In the example of FIG. 2, master latch 102-1 and slave latch 102-2 may each have a data line input, a read control input, first and second address inputs, and an output. In particular, master latch 102-1 may have a data line input that receives incoming data signal D via inverter 106, a read control input that is coupled to ground power supply line 120 (e.g., a power supply line on which ground power supply voltage Vss is provided), a first address input that receives signal Clk, a second address input that receives signal Clkb, and an output. Slave latch 102-2 may have a data line input that receives data bits from the output of master latch 102-1 via inverter 108 and transmission gate 110, a read control input that receives ground power supply voltage Vss, a first address input that receives Clkb, a second address input that receives Clk, and an output.

Inverter 108 and transmission gate 110 may be connected in series between the output of master latch 102-1 and the data line input of slave latch 102-2. Inverter 116 may receive data bits from the output of slave latch 102-2 and may generate a corresponding output signal Qb. Data output signal Qb may represent an inverted (complement) and latched version of incoming signal D. In certain embodiments, flip-flop 100 need not include inverter 116. In such scenarios, data output signal Q may be provided at the output of slave latch 102-2, where signal Q represents the true latched version of signal D.

Clocked storage element 100 of FIG. 2 is merely illustrative and does not serve to limit the scope of the present invention. If desired, storage element 100 may include any number of inverters interposed in the data path between the data input and the data output of element 100. It should be appreciated that circuitry 118 may include other circuits (not shown in FIG. 2) peripheral to the master and slave latches.

It may be desirable for clocked storage element 100 to exhibit immunity to soft error upset (SEU) events (sometimes referred to as single event upsets). One way for storage element 100 to exhibit SEU immunity is for latches 102 (e.g., master latch 102-1 and slave latch 102-2) to be implemented using memory cell structures such as a memory cell structure of the type shown in FIG. 3.

Figure 3:
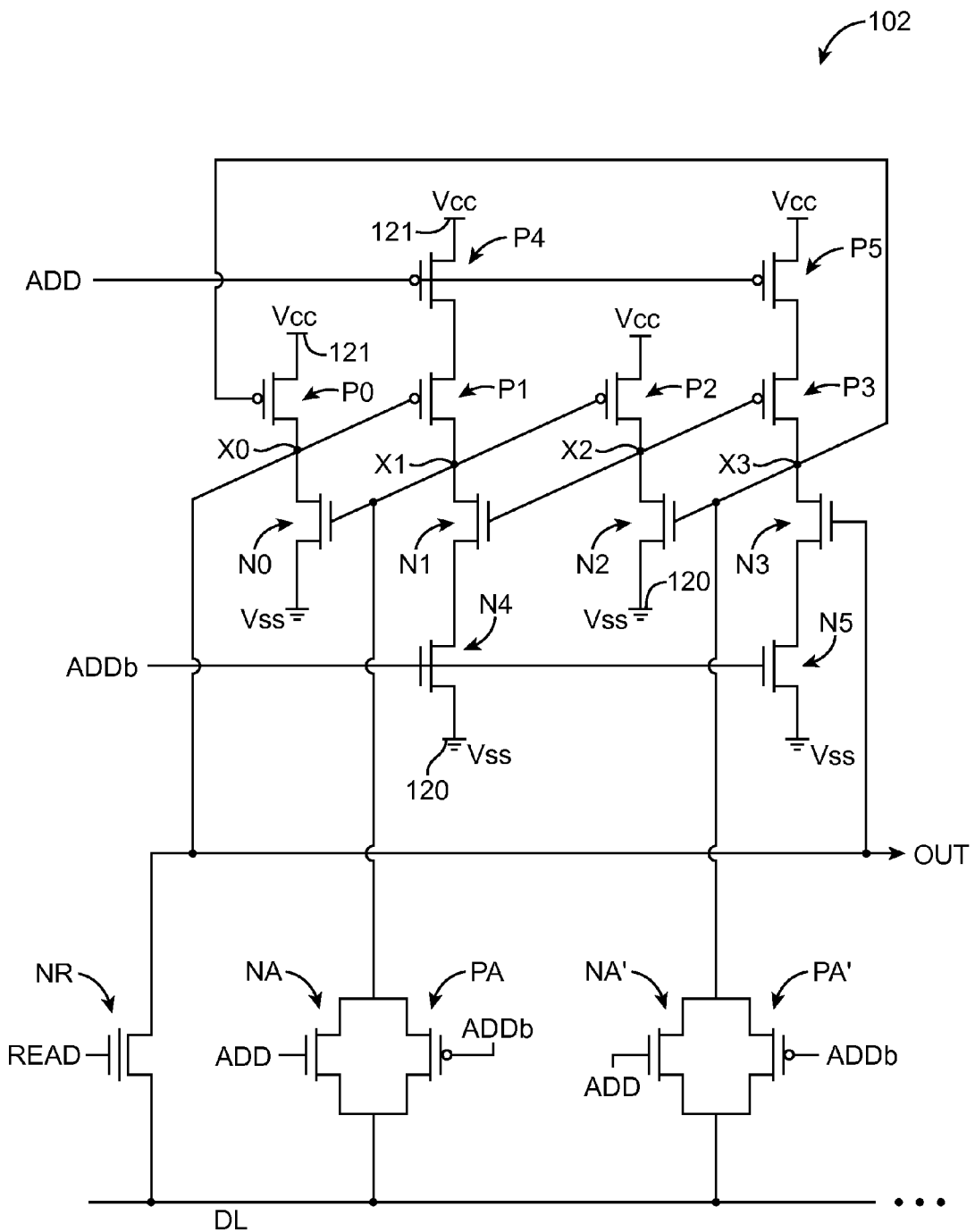
FIG. 3 is a circuit diagram of an illustrative DICE latch circuit in accordance with an embodiment of the present invention.

FIG. 3 is a circuit diagram of latch (or memory cell) circuit 102. As shown in FIG. 3, latch 102 may include first, second, third, and fourth inverting circuits interconnected in a ring to form a bistable element. The first inverting circuit may include a p-channel transistor such as p-channel transistor P0 and an n-channel transistor such as n-channel transistor N0. Transistors P0 and N0 may be coupled between a positive power supply line 121 (e.g., a positive power supply line on which positive power supply voltage Vcc is provided) and ground line 120. Transistor P0 may have a source terminal that is connected to the positive power supply line. Transistor N0 may have a source terminal that is connected to the ground line. Transistors P0 and N0 may each have a drain terminal that is connected to an intermediate node X0. The second inverting circuit may include p-channel transistors P1 and P4 and n-channel transistors N1 and N4. Transistors P1 and P4 may be connected in series and may be coupled between positive power supply line 121 and an intermediate node X1. Transistors N1 and N4 may be connected in series with each other between intermediate node X1 and the ground line and may be connected in series with transistors P1 and P4.

The third inverting circuit may include p-channel transistor P2 and n-channel transistor N2. Transistors P2 and N2 may be coupled between the positive power supply line and the ground line. Transistors P2 and N2 may have source terminals that are connected to the positive power supply line and the ground line, respectively. Transistors P2 and N2 may each have a drain terminal that is connected to an intermediate node X2.

The fourth inverting circuit may include p-channel transistors P3 and P5 and n-channel transistors N3 and N5. Transistors P3 and P5 may be connected in series and may be coupled between the positive power supply line and an intermediate node X3. Transistors N3 and N5 may be connected in series and may be coupled between intermediate node X3 and the ground line. Transistors N3 and N5 may be connected in series with transistors P3 and P5.

Transistors P0-P5 may each have a body (bulk) terminal that is connected to an appropriate well bias such as positive power supply line 121. Transistors N0-N5 may each have a body terminal that is connected to an appropriate well bias such as ground line 120. Transistors P0, P1, P2, and P3 may have gate terminals that are connected to intermediate nodes X3, X0, X1, and X2, respectively. Transistors N0, N1, N2, and N3 may have gate terminals that are connected to nodes X1, X2, X3, and X0, respectively.

Transistors P4 and P5 may have gate terminals that are controlled by a true address signal that is provided over an associated address input line ADD. Transistors N4 and N5 may have gate terminals that are controlled by a complement address signal (e.g., a signal that is an inverted version of the true address signal) that is provided over an associated complement address line ADDb. True and complement address input lines ADD and ADDb may serve as the first and second address inputs, respectively, for latch 102 (see, FIG. 2).

During normal operation of latch 102, the signals on address lines ADD and ADDb may be deasserted (e.g., the true address signal may be low while the complement address signal may be high) to enable the second and fourth inverting circuits to function properly.

During write operations, the signals on address lines ADD and ADDb may be asserted (e.g., the true address signal may be high while the complement address signal may be low) to turn off transistors P4, P5, N4, and N5. Turning off transistors P4, P5, N4, and N5 breaks the pull-up and pull-down current paths of the second and fourth inverting circuits. Breaking the pull-up and pull-down current paths in this way allows nodes X1 and X3 to float, because no direct current path exists from the power supply lines to actively drive nodes X1 and X3. Transistors P4 and P5 may sometimes be referred to as tri-state pull-up transistors. Transistors N4 and N5 may sometimes be referred to as tri-state pull-down transistors. Asserting the address signals during write operations to place the second and fourth inverting circuits in this tri-state mode (tri-stating the second and fourth inverting circuits) helps allow latch 102 to be more easily overwritten with a desired data value.

Latch 102 may include access transistors such as n-channel transistors NA, NA', and NR and p-channel transistors PA and PA'. In the example of FIG. 3, access transistors NA and PA are coupled in parallel between data storage node X1 and a data line DL (e.g., a data line through which data signals are read from or written into latch 102). Similarly, transistors NA' and PA' are coupled in parallel between data storage node X3 and data line DL. Transistor NR is coupled between data storage node X0 and data line DL. Data line DL may serve as the data line input for latch 102.

N-channel transistors NA and NA' may have gates that are coupled to address line ADD (e.g., transistors NA and NA' may be controlled by the true addressing signal), whereas p-channel transistors PA and PA' may have gates that are coupled to address line ADDb (e.g., transistors PA and PA' may be controlled by the complement addressing signal). Transistor NR may have a gate that is coupled to a read control line READ. Control line READ may serve as the read control input for latch 102. Transistors NA, NA', PA, and PA' that are controlled using address signals are sometimes referred to collectively as address transistors, whereas transistor NR is sometimes referred to as the read circuit. Configured in this way, the address transistors may be used during data loading operations to write desired data bits into latch 102, whereas read circuit NR may be used to read stored data from latch 102.

Generally, any number of address and/or access transistors may be connected to any number of the intermediate nodes to provide desired read/write functionality and performance, if desired. Other read (sensing) schemes (e.g., read circuits with different numbers of transistors, a differential read scheme that uses sense amplifiers, etc.) may be used, if desired.

Transistors P0-P5 and N0-N5 as arranged in FIG. 3 may serve as a memory storage portion that stores data for latch 102. The storage portion may store data (in true and complement form) on intermediate nodes X0-X4. Intermediate nodes X0-X4 may therefore be referred to as internal data storage nodes. Any of these nodes may be used as the output of latch 102. As an example, node X0 may serve as output terminal OUT for latch 102.

Latch 102 may exhibit bistable operation. When latch 102 has been loaded with a logic "0," the values of X0, X1, X2, and X3 will be "1," "0,", "1," and "0," respectively. When memory element has been loaded with a "1," the values of X0, X1, X2, and X3 will be "0," "1,", "0," and "1," respectively. In this context, the value stored at nodes X1 and X3 may represent a stored bit that currently retained by latched 102. Thus, writing a "0" into latch 102 may imply that a "0" is being written to storage nodes X1 and X3.

Unlike conventional memory element designs that are based on a pair of cross-coupled inverters, latch 102 of FIG. 3 includes four inverting circuits that are connected in a ring. In conventional cross-coupled inverter designs, there is a relatively strong likelihood that a radiation strike on an inverter's input node will cause the inverter's output to change states, thereby flipping the state of the latch to an erroneous value. In the arrangement of FIG. 3, the gate of the p-channel transistor (e.g., transistors P0-P3) in each inverting circuit receives its input from a different source than the gate of the n-channel transistor in the same inverting circuit (e.g., transistors N0-N3). Because the control signals for the gates of the transistors are distributed in this way, latch 102 is better able to recover from a radiation strike on a particular node without flipping its state than conventional memory elements based on cross-coupled inverters.

During normal operation, the address signals may be deasserted. As a result, transistors P4 and P5 are turned on because the address signal on line ADD is low and transistors N4 and N5 are turned on because the address signal on line ADDb is high. The second and fourth inverting circuits of latch 102 are therefore active and latch 102 holds its loaded data value and exhibits immunity to radiation-induced upset events.

Consider, as an example, a situation in which node X0 and node X2 are low (at logic "0") and node X1 and node X3 are high (at logic "1"). If radiation strikes node X0, radiation-induced charge on node X0 may cause the voltage on node X0 to go high (e.g., to positive power supply voltage Vcc or even higher). When the voltage on node X0 goes high, transistor N3 in the fourth inverting circuit turns on. The voltage on node X2 is low, so transistor P3 is already on. With both transistor N3 and P3 on, the voltage on node X3 falls to about Vcc/2 (i.e., midway between positive power supply voltage Vcc and ground voltage Vss).

The high X0 voltage that was produced by the radiation strike is routed to the gate of transistor P1. This turns off transistor P1. Transistor N1 has a gate controlled by the signal on node X2. Because node X2 is low, transistor N1 is off. When transistor P1 is turned off while transistor N1 is off, node X1 is no longer directly connected to either positive power supply voltage Vcc on the positive power supply line or ground voltage Vss on the ground power supply line. Node X1 therefore floats, retaining its original high state, despite the radiation strike.

The unperturbed signal on node X1 serves as a control signal that is applied to the gate of transistor P2. Before the radiation strike, node X1 was high and transistor P2 was off.

After the radiation strike, node X1 retains its original high state, so the state of transistor P2 is unchanged. Transistor N2 is controlled by a reduced high voltage (Vcc/2), but is able to hold node X2 low, because transistor P2 remains off. As with the unperturbed signal on node X1, the voltage on node X2 is therefore unperturbed by the radiation strike.

Because the voltage on node X2 remains low, transistor P3 remains on and pulls node X3 high. Even though node X3 is momentarily reduced in voltage from Vcc to Vcc/2, the node X3 signal is still able to hold transistor P0 at least partially off, so that transistor N0, which is held on by unperturbed high signal on node X1, is able to pull node X0 low. Eventually, the radiation-induced charge on node X0 that momentarily elevated the voltage on node X0 will dissipate and node X0 will return to its normal (pre-strike) state of zero volts. Once X0 reaches zero volts, transistor N3 turns off and node X3 regains its pre-strike voltage of Vcc.

As this example demonstrates, the architecture of latch 102 allows the latch to retain its stored data value (a stored "1" in this example), even when a node in the latch is struck by radiation. The immunity of latch 102 to undesired changes in state from radiation strikes helps to ensure that clocked storage element 100 will exhibit stable operation in a variety of circumstances. Data storage nodes X0 and X2 may serve to store the same data value and may sometimes be referred to as a "redundant" node pair (e.g., node X2 may be redundant to node X0, or vice versa). Similarly, data storage nodes X1 and X3 may serve to store the same data value and may also be referred to as a redundant node pair (e.g., node X3 may be redundant to node X1, or vice versa). If only one node in a pair of redundant nodes is disturbed, then latch 102 will be capable of recovering from the disturbed state. The use of redundant nodes may therefore serve to enhance SEU performance. More or fewer than four inverting circuits may be used to form the bistable storage portion of latch 102, if desired. Latch 102 that includes four inverting circuits in the arrangement of FIG. 3 is sometimes referred to as a dual interlocked cell (DICE) memory element that demonstrates SEU immunity.

When latch 102 is being used as part of clocked storage element 100, latch 102 may have control line READ that is coupled to the ground line, address lines ADD and ADDb that respectively receive true and inverted versions of signal Clk, a data line DL that serves as the data line input terminal for latch 102, and an output line OUT (e.g., an output terminal that is coupled to node X0) that serves as the data output for latch 102. Connecting the read control line of latch 102 to ground prevents any read operation from being performed (e.g., read circuit NR is always deactivated). Read operations are not necessary since the state of latch 102 is directly accessed by tapping one of the internal data storage nodes. If desired, latch 102 need not include a read circuit NR.

The circuit arrangement of FIG. 3 is merely illustrative and does not serve to limit the scope of the present invention. If desired, latch 102 may include any number of inverting circuits (e.g., more than two inverting circuits, more than three inverting circuits, more than four inverting circuits, etc.), any type of access circuits, any suitable mechanism for enhancing SEU performance, etc.

Figure 4:
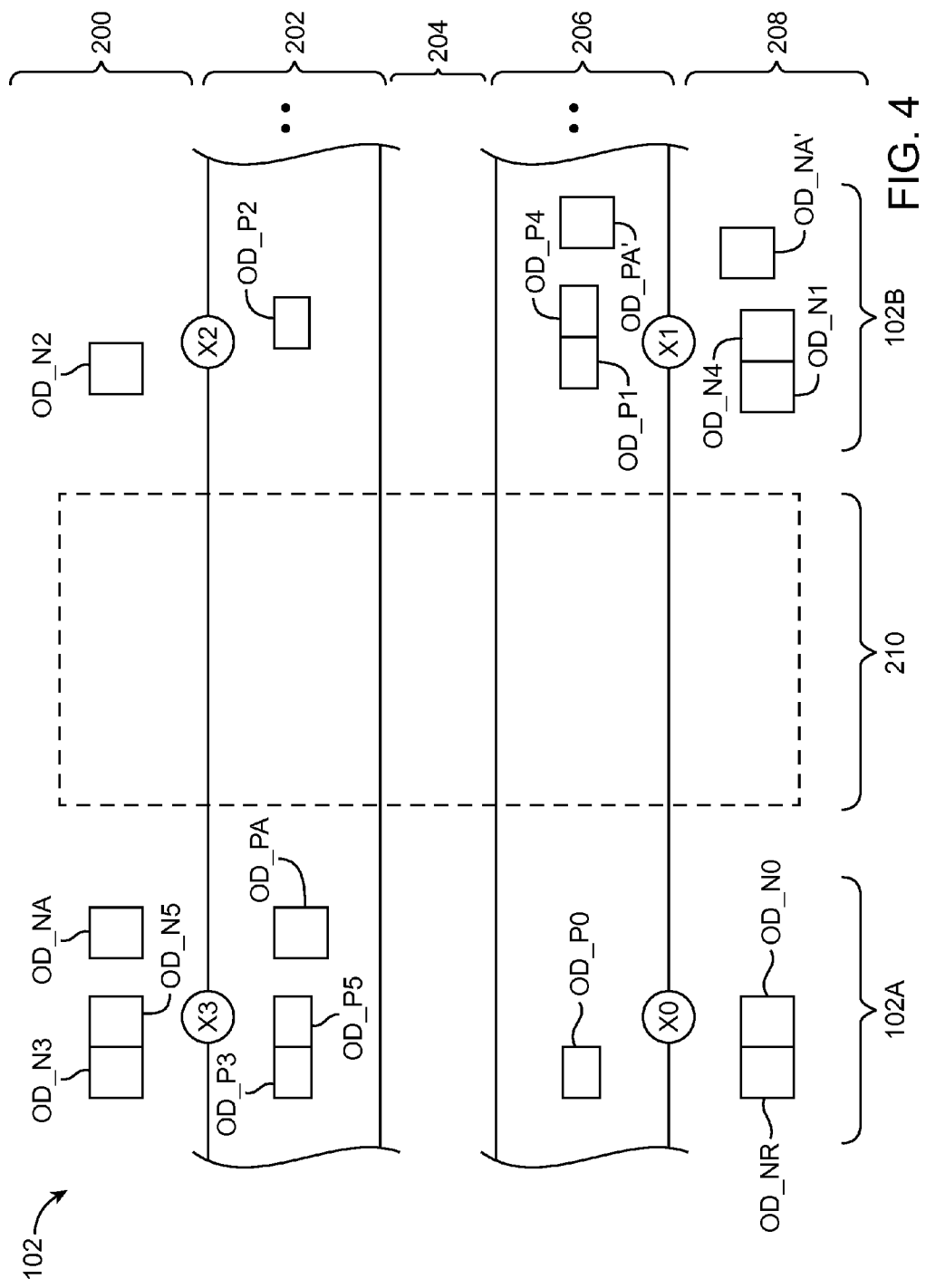
FIG. 4 is a top layout view of an illustrative DICE latch circuit in accordance with an embodiment of the present invention.

FIG. 4 is a top layout view showing one suitable transistor arrangement of latch 102. The transistors of latch 102 may be formed in respective well regions in a semiconductor substrate (e.g., a p-type substrate). In some embodiments, the different well regions may be formed in a striped arrangement on the semiconductor substrate. The re-channel latch transistors may be formed in p-well regions 200, 204, and 208, whereas the p-channel latch transistors may be formed in n-well regions 202 and 206. At least some of these n-wells and p-wells may be formed in a striped configuration (e.g., alternating stripes of n-wells and p-wells may be formed in the surface of the p-type substrate). As shown in FIG. 4, n-well 202 may be interposed between p-wells 200 and 204, whereas n-well 206 may be interposed between p-wells 204 and 208.

Each transistor may include an oxide definition (OD) or diffusion region that sets the width of each device and a conductive gate structure (not shown) that is formed over the diffusion region. The location of the diffusion region of each transistor in latch 102 is illustrated in FIG. 4. In the example of FIG. 4, n-channel transistors N3, N5, NA, and N2 are formed in p-well region 200; p-channel transistors P3, P5, PA, and P2 are formed in n-well region 202; p-channel transistors P0, P1, P4, and PA' are formed in n-well region 206; and n-channel transistors NR, N0, N1, N4, and NA' are formed in p-well region 208.

In particular, transistors N3, N5, NA, P3, P5, PA, P0, NR, and N0 may be formed in a first portion 102A of latch 102. Transistors N2, P2, P1, P4, PA', N1, N4, and NA' may be formed in a second portion 102B of latch 102. Portions 102A and 102B may be physically separated by region 210. Region 210 may contain circuitry that is not considered part of this particular latch 102 (e.g., region 210 may include transistors from another latch, from control circuitry 118 in storage element 100, and/or from other circuits on the integrated circuit). If desired, region 210 need not include any transistors.

In this particular example, data storage node X0 may be positioned in the vicinity of transistors P0 and N0 in latch portion 102A (e.g., node X0 may be driven by the first inverting circuit in latch 102), whereas data storage node X1 may be positioned in the vicinity of transistors P1 and N1 in latch portion 102B (e.g., node X1 may be driven by the second inverting circuit in latch 102). Similarly, data storage node X3 may be located between transistors N3 and P3 within latch portion 102A (e.g., node X3 may be driven by the fourth inverting circuit in latch 102), whereas data storage node X2 may be located between transistors N2 and P2 within latch portion 102B (e.g., node X2 may be driven by the third inverting circuit in latch 102). Arranged in this way, each of the two nodes in a redundant node pair is placed in separate n-well regions while the distance between each pair of redundant nodes is increased. Increasing the distance between nodes X0 and X2, for example, may reduce the interaction between the two nodes. Placing the redundant node pair (e.g., nodes X1 and X3) in separate n-wells may help reduce charge sharing between the two nodes. In general, reducing the interaction and the charge sharing between redundant node pairs may help improve the SEU performance of latch 102.

Figure 5:
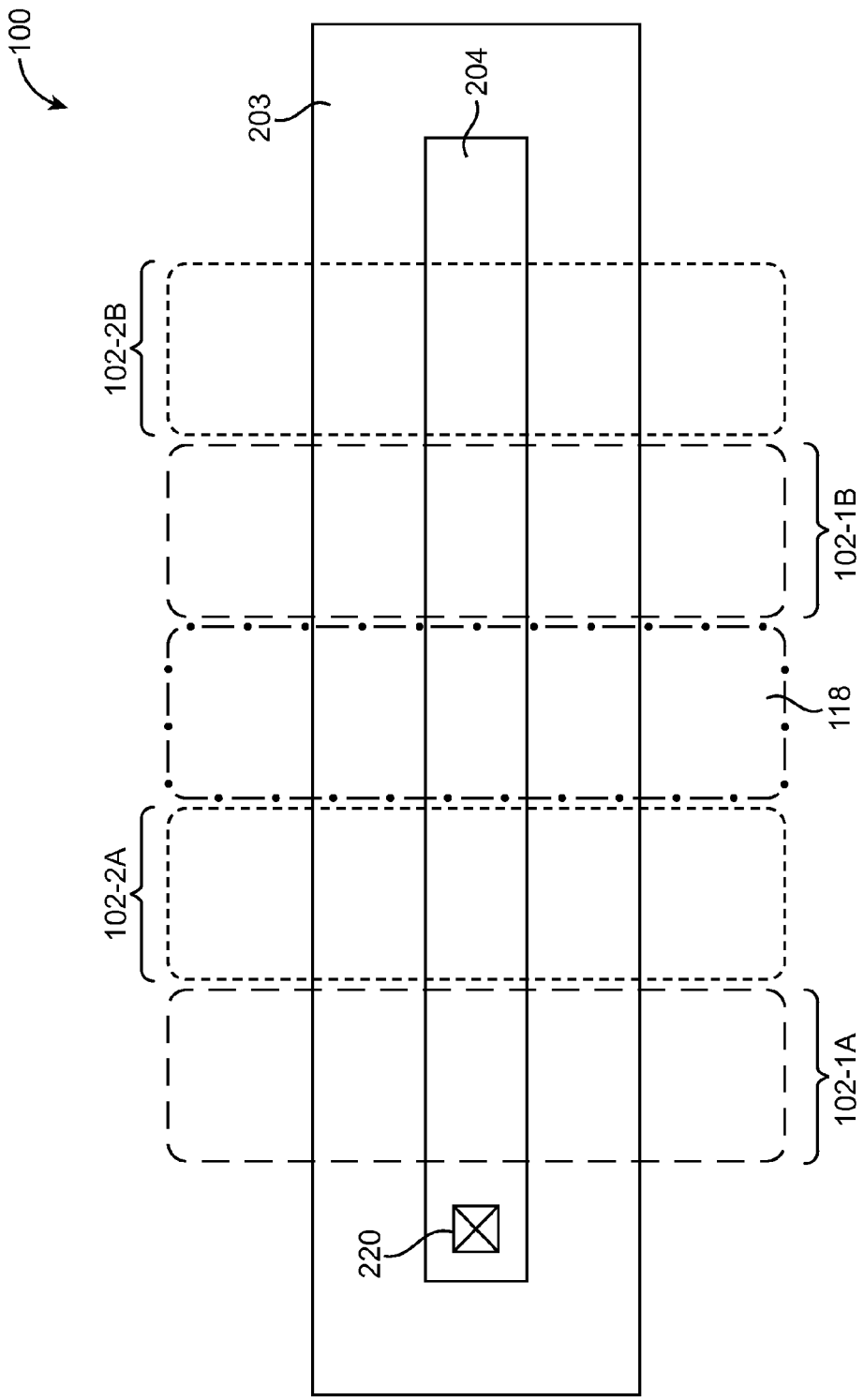
FIG. 5 is a top layout view of an illustrative clocked storage element that includes DICE latch circuits of the type shown in FIG. 4 in accordance with an embodiment of the present invention.

FIG. 5 is a top layout view showing one suitable arrangement of flip-flop 100. As shown in FIG. 5, p-well region 204 may be surrounded by n-well region 203 (e.g., n-well strip 204 may be completely enclosed within donut-shaped p-well region 203). N-well region 203 of FIG. 5 may be equivalent to n-well regions 202 and 206 of FIG. 4. A p-well contact such as contact 220 may be formed in p-well 204 to provide a proper bias voltage to p-well 204.

As described previously in connection with FIG. 2, flip-flop 100 may include a master latch 102-1, a slave latch 102-2, and associated latch control circuitry 118. As described in connection with FIG. 4, a latch 102 may be separated into first and second portions 102A and 102B (e.g., circuitry other than the transistors associated with that latch 102 may be physically interposed between portions 102A and 102B). For example, master latch 102-1 may be physically separated into first master latch portion 102-1A and second master latch portion 102-1B, whereas slave latch 102-2 may be physically separated into first slave latch portion 102-2A and second slave latch portion 102-2B (see, e.g. FIG. 5).

As shown in the example of FIG. 5, first slave latch portion 102-2A and control circuitry 118 may be physically interposed between master latch portions 102-1A and 102-1B (e.g., at least some slave latch transistors and peripheral control transistors 118 may be formed in region 210 associated with master latch 102-1). At the same time, second master latch portion 102-1B and control circuitry 118 may be physically interposed between slave latch portions 102-2A and 102-2B (e.g., at least some master latch transistors and peripheral control transistors 118 may be formed in region 210 associated with slave latch 102-2). Forming flip-flop circuit 100 by "inter-digitizing" (or interleaving) the master and slave DICE latches in this way may serve to improve SEU immunity without increasing the area of circuit 100.

Figure 6:
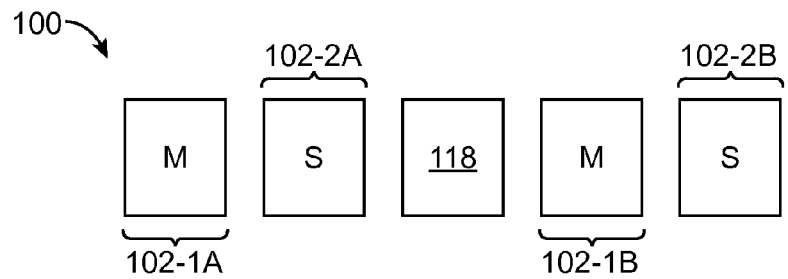
FIGS. 6-9 are diagrams showing different layout arrangements for a clocked storage element in accordance with an embodiment of the present invention.

The way in which master latch 102-1 and slave latch 102-2 are physically interspersed with each other as shown in FIG. 5 is merely illustrative. FIG. 6 is a block diagram illustrating the master-slave interspersed arrangement that is equivalent to that of FIG. 5. FIGS. 6-9 are similar block diagrams showing other suitable arrangements in which the master and slave latches can be interleaved with one another.

Figure 7:
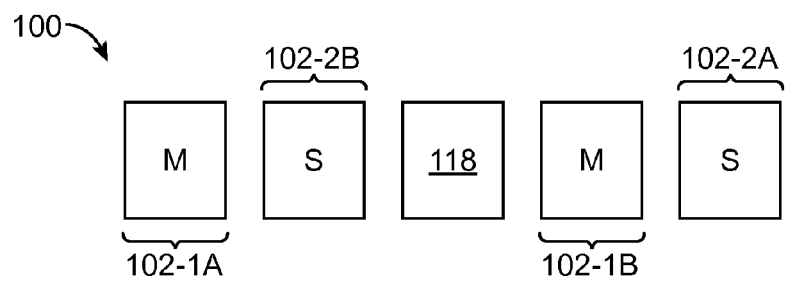

In the exemplary arrangement of FIG. 7, the master and slave latches can be interspersed and "mirrored" with respect to each other. For example, second slave latch portion 102-2B and control circuitry 118 may be interposed between master latch portions 102-1A and 102-1B. At the same time, second master latch portion 102-1B and control circuitry 118 may be interposed between slave latch portions 102-2A and 102-2B. The master and slave latches may be considered to be physically mirrored in this scenario because first master latch portion 102-1A and first slave latch portion 102-2A are formed at the left and right edges of element 100 (e.g., second master latch portion 102-1B, second slave latch portion 102-2B, and control circuitry 118 are formed between the first master and slave latch portions).

Figure 8:
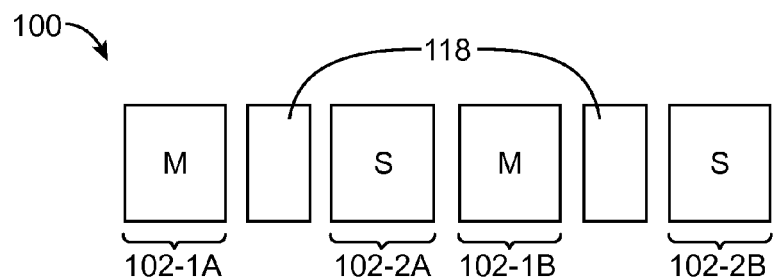

In the exemplary arrangement of FIG. 8, the control circuitry 118 may be separated into different portions and may be distributed among the interleaved master and slave latches. For example, first slave latch portion 102-2A and a first portion of control circuitry 118 may be interposed between master latch portions 102-1A and 102-1B. Meanwhile, second master latch portion 102-1B and a second portion of control circuitry 118 may be interposed between slave latch portions 102-2A and 102-2B. In general, control circuitry 118 may be separated into any suitable number of groups within clocked storage element 100.

Figure 9:
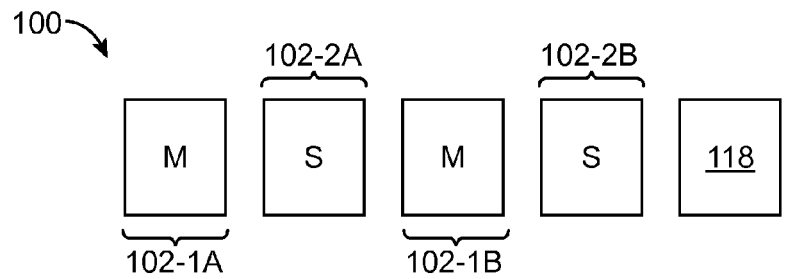

In certain embodiments, control circuitry 118 need not be interposed between the different portions of the master and slave latches (see, e.g., FIG. 9). In the exemplary arrangement of FIG. 9, the control circuitry 118 may be formed at one of the edges of flip-flop 100. For example, only the first slave latch portion 102-2A may be interposed between master latch portions 102-1A and 102-1B. Meanwhile, only the second master latch portion 102-1B may be interposed between slave latch portions 102-2A and 102-2B. If desired, control circuitry 118 may be placed at the left or right edge of clocked storage element 100.

The different configurations as shown in connection with FIGS. 6-9 are merely illustrative and do not serve to limit the scope of the present invention. In general, clocked storage element 100 may include master and slave latches 102 and associated control circuitry 118 that are interleaved in any suitable way such that the redundant nodes of each latch are physically separated with interposing circuitry and are formed in separate well regions.

The foregoing is merely illustrative of the principles of this invention and various modifications can be made by those skilled in the art without departing from the scope and spirit of the invention. The foregoing embodiments may be implemented individually or in any combination.

What is claimed is:

1. A clocked storage element, comprising:
   a control input configured to receive a clock signal;
   a first latch circuit that receives the clock signal; and
   a second latch circuit that receives the clock signal, wherein the first latch circuit and the second latch circuit are coupled in series, wherein the first latch circuit includes more than two cross-coupled inverting circuits, wherein the first and second latch circuits are formed in a region having a p-well enclosed by a donut-shaped n-well, and wherein the first latch includes n-channel transistors and p-channel transistors that are physically interposed between the n-channel transistors.

2. The clocked storage element defined in claim 1, wherein the first latch circuit includes four cross-coupled inverting circuits.

3. The clocked storage element defined in claim 1, wherein each of the first and second latch circuits includes four cross-coupled inverting circuits.

4. The clocked storage element defined in claim 1, wherein the first latch circuit includes a given data storage node and an associated redundant data storage node, and wherein the given data storage node and the redundant data storage node store data signals of equal voltage levels.

5. The clocked storage element defined in claim 1, wherein at least one of the inverting circuits in the first latch circuit includes a transistor that receives the clock signal.

6. The clocked storage element defined in claim 5, wherein the first latch circuit further includes:
   an access circuit coupled to the inverting circuits, wherein the access circuit receives the clock signal.

7. The clocked storage element defined in claim 1, wherein the inverting circuits in the first latch circuit are interconnected to form a bistable memory element having a plurality of data storage nodes, wherein a given data storage node in the plurality of storage nodes is coupled between an n-channel transistor and a p-channel transistor in at least one of the inverting circuits in the first latch circuit, and wherein the given data storage node serves as an output for the first latch circuit.

8. Flip-flop circuitry, comprising:
   a data input;
   a data output;
   a control input that receives a clock signal;
   a first latch circuit that receives the clock signal; and
   a second latch circuit that receives the clock signal, wherein the first and second latch circuits are coupled in series between the data input and the data output, wherein at least part of the second latch circuit is physically interposed between a first portion of the first latch circuit and a second portion of the first latch circuit, and wherein the interposing part of the second latch circuit and the first and second portions of the first latch circuit share a common n-well.

9. The flip-flop circuitry defined in claim 8, wherein at least part of the first latch circuit is interposed between a first portion of the second latch circuit and a second portion of the second latch circuit.

10. The flip-flop circuitry defined in claim 9, wherein the second latch circuit includes a plurality of inverting circuits interconnected to form a bistable element having a given data storage node and an associated redundant data storage node, wherein the given data storage node and the redundant data storage node store data signals of equal voltage levels, wherein a first inverting circuit in the plurality of inverting circuits that drives the given data storage node is formed in the first portion of the second latch circuit, wherein a second inverting circuit in the plurality of inverting circuits that drives the redundant data storage node is formed in the second portion of the second latch circuit.

11. The flip-flop circuitry defined in claim 8, wherein the first latch circuit includes a plurality of inverting circuits interconnected to form a bistable element having a given data storage node and an associated redundant data storage node, wherein the given data storage node and the redundant data storage node store data signals of equal voltage levels, wherein a first inverting circuit in the plurality of inverting circuits that drives the given data storage node is formed in the first portion of the first latch circuit, and wherein a second inverting circuit in the plurality of inverting circuits that drives the redundant data storage node is formed in the second portion of the first latch circuit.

12. The flip-flop circuitry defined in claim 11, wherein at least part of the first inverting circuit is formed in a first well region of a first doping type, wherein at least part of the second inverting circuit is formed in a second well region of the first doping type, and wherein the first and second well regions are separated by a third well region of a second doping type that is different than the first doping type.

13. The flip-flop circuitry defined in claim 8, further comprising:
control circuitry, wherein at least some of the control circuitry is electrically coupled between the first and second latch circuits, and wherein at least part of the control circuitry is physically interposed between the first and second portions of the first latch circuit.

14. The flip-flop circuitry defined in claim 8, wherein the first and second latch circuits are physically interleaved with respect to one another.

15. The flip-flop circuitry defined in claim 8, wherein the first and second latch circuits are physically mirrored with respect to one another.

16. A data storage element, comprising:
a latch circuit that includes a plurality of inverting circuits interconnected to form a bistable element having a given data storage node and an associated redundant data storage node, wherein:
the given data storage node and the redundant data storage node store data signals of equal voltage levels;
a first inverting circuit in the plurality of inverting circuits that drives the given data storage node is partly formed in a first well region of a first doping type;
a second inverting circuit in the plurality of inverting circuits that drives the redundant data storage node is partly formed in a second well region of the first doping type; and
the first and second well regions are separated by a third well region of a second doping that is different than the first doping type and that is devoid of any transistor structures.

17. The data storage element defined in claim 16, further comprising:
an additional latch circuit, wherein at least part of the additional latch circuit is physically formed between a first portion of the latch circuit that includes the first inverting circuit and a second portion of the of the latch circuit that includes the second inverting circuit.

18. The data storage element defined in claim 17, wherein the latch circuit and the additional latch circuit each include more than two inverting circuits.

19. The data storage element defined in claim 17, wherein the data storage element comprises a flip-flop, the flip-flop further comprising:
control circuitry, wherein at least part of the control circuitry is physically formed between the first and second portions of the latch circuit.

20. A clocked storage element, comprising:
a control input configured to receive a clock signal;
a first latch circuit that receives the clock signal;
a second latch circuit that receives the clock signal, wherein the first latch circuit and the second latch circuit are coupled in series, wherein the first latch circuit includes more than two cross-coupled inverting circuits, and wherein the first and second latch circuits are formed in a region having a p-well enclosed by a donut-shaped n-well; and
a control circuit that is coupled between the first and second latch circuits, wherein a portion of the second latch circuit is physically interposed between a first portion of the first latch circuit and a second portion of the first latch circuit, and wherein the control circuit is physically interposed between the portion of the second latch circuit and the second portion of the first latch circuit.

* * * * *